April 14, 1970 W. A. GOTTFRIED 3,506,441
DOUBLE PHOTORESIST PROCESSING
Filed June 2, 1967
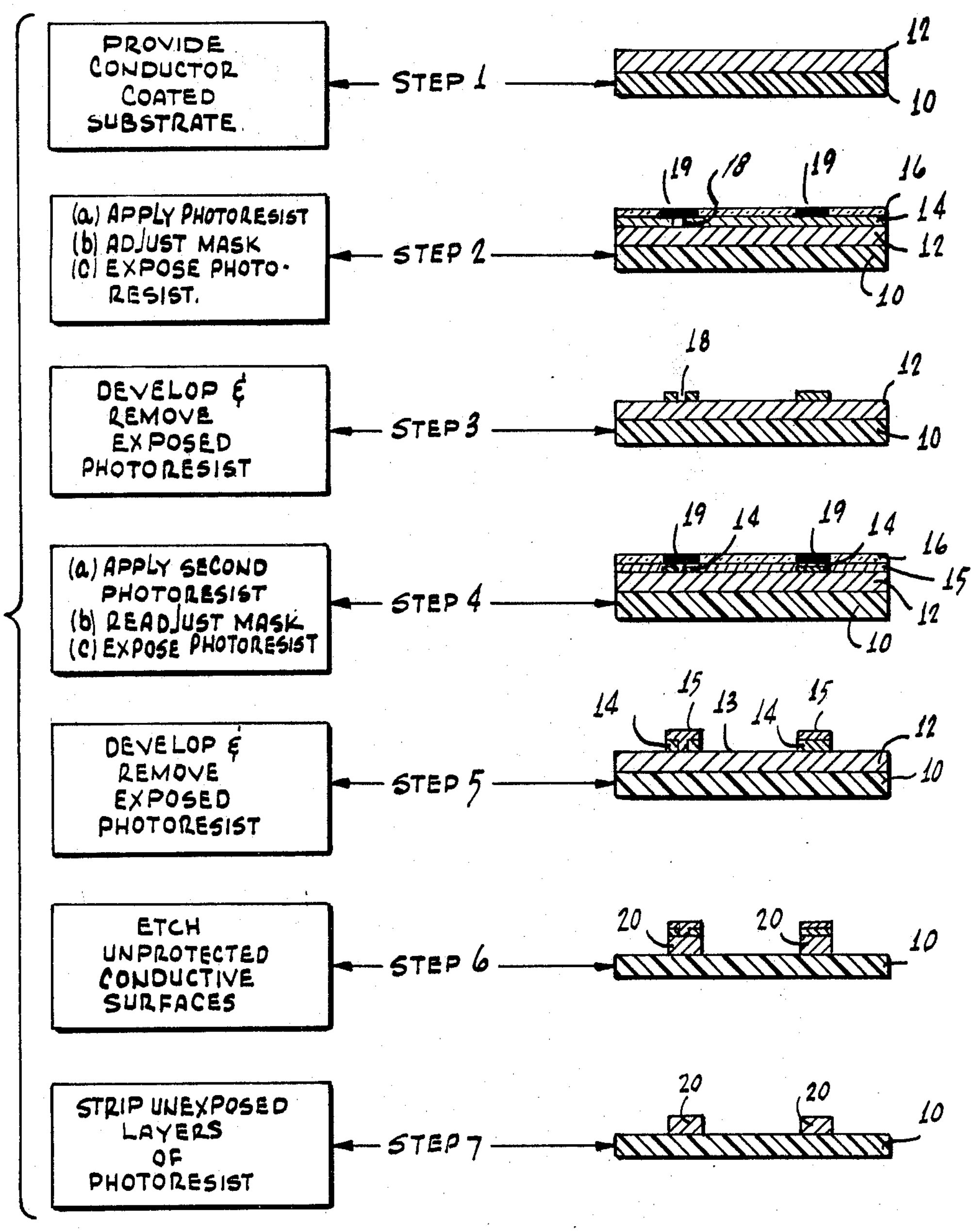
INVENTOR
WILLIAM A. GOTTFRIED
BY Edward J Norton
ATTORNEY United States Patent Office 3,506,441

Patented Apr. 14, 1970

3,506,441

DOUBLE PHOTORESIST PROCESSING

William A. Gottfried, Philadelphia, Pa., assignor to RCA Corporation, a corporation of Delaware Filed June 2, 1967, Ser. No. 643,139
Int. Cl. G03c *5/00*
U.S. Cl. 96—36.2 5 Claims

ABSTRACT OF THE DISCLOSURE

There is disclosed a method for producing printed circuit substrates having closely spaced, fine line circuitry devoid of pinholes. Any imperfection formed during the application, exposure, or development of an initial layer of photosensitive material upon a circuit substrate, which would result in a pinhole within the desired circuitry upon the exposure of the substrate to an etchant, is corrected by the application of an additional layer of photoresist which is subsequently exposed and developed.

BACKGROUND OF THE INVENTION

In the manufacture of printed circuits, a layer of photosensitive material (photoresist) is deposited on a conductive surface, i.e., a sheet of copper, which has been mounted upon a dielectric substrate. An image of the desired circuitry is then printed on the conductive surface by exposing the layer of photoresist through a photomask having delineated thereon an image of the desired circuitry; the image provided by the mask resulting in a desired pattern of exposure of the photosensitive layer lying therebeneath. The portions of the photoresist layer not corresponding to the desired circuit pattern are then caused to be developed and removed, leaving an image of the desired circuitry in the form of the remaining portion of the photoresist imprinted upon the conductive surface. The substrate assembly is then exposed to an etchant which etches away those portions of the conductive surface not protected by the remaining portions of the layer of photoresist. Finally, the non-exposed layer of photoresist is stripped from the conductive circuitry revealing a copper circuit.

In the production of printed circuits as heretofore described, it has been found that to obtain the optimum resolution of closely spaced, fine line circuitry, it is desirable to utilize, to the extent possible, an exceedingly thin layer of photoresist. Unfortunately, the use of such a thin layer will often cause the photoresist to develop tiny pinholes as a result of surface tension and associated fluid phenomena. Should such pinholes happen to appear upon a portion of the surface of the conductive sheet where the desired circuitry is ultimately to appear, the etching step will remove that portion of the conductive layer appearing through the pinhole thereby resulting in a "honeycombed" circuit.

SUMMARY OF THE INVENTION

To overcome this problem it has been found desirable to utilize a double printing technique. This is accomplished by applying a second layer of photoresist to the surface of the substrate assembly subsequent to the first development step and prior to the etching step. The photomask is then reapplied and a second image imprinted on top of, and in alignment with, the first printed image. After development and removal of the undesired portions of this second layer of photosensitive material, the conductive material not protected is then exposed to an etchant leaving the desired circuitry. The two layers of photoresist which remain upon the circuitry may then be stripped therefrom. Any pinholes which may have been present in the first layer of photoresist are generally filled in upon the application of the second layer. Pinholes occurring in the second layer are generally of no concern unless they happen to coincide with a pinhole within the first layer. The likelihood of such coincidence, though remote, is conceivable particularly in light of the fact that, where thin layers of the same material are applied, the pinholes within the lower layer have a tendency to try and propagate themselves upward thereby resulting in coincident pinholes through both layers. The possibility of such an occurrence however may be essentially eliminated by utilizing different photosensitive materials for each of the layers.

Accordingly it is an object of the present invention to provide a method of producing printed circuit boards or substrates having closely spaced, fine line circuitry devoid of pinholes.

BRIEF DESCRIPTION OF THE DRAWINGS

The invention will be described in greater detail by reference to the single figure which is a flow chart of the method steps of the invention and includes corresponding cross-sectional views of the printed circuit substrate at the respective steps in accordance with one embodiment of the present invention.

Similar reference characters are applied to similar elements throughout the figure.

DESCRIPTION OF THE PREFERRED EMBODIMENT

In accordance with one embodiment of this invention a dielectric substrate 10 having a clean sheet of copper 12 mounted on one surface thereof is dip-coated by submersing it into a tank which contains the desired photoresist material to be used for the first layer. In practice it has been found desirable to use Kodak Photo-Resist No. 2 (KPR–2) which is a polyvinyl cinnamate negative resist. It should be understood however that the described method is equally applicable where it is desired that positive resists or combinations of negative and positive resists to be used.

The substrate is then withdrawn from the tank at a controlled rate of speed calculated to result in the application to the copper surface of a layer of photoresist 14 of the desired thickness; i.e., in the order of .0001 inch. The application of a dip-coating technique for applying the first layer of photoresist 14 has been found desirable because the copper surface 12 may contain a scratch thereon. In such a case it has been found that a thin layer of photoresist applied by roller coat or spray techniques will have a tendency during drying to shrink and result in a bridge across the top of the scratch. During the subsequent etching stage, the scratch has a tendency to act as a capillary causing the etchant to undercut the area covered by the photoresist bridge and result in a void of conductive material thereunder. By utilizing a dip-coating technique there is more of a tendency for the photoresist to penetrate and dry in the scratch. The first layer of photoresist 14 is then exposed through a metallized glass mask 16 having delineated thereon an image 19 of the desired circuitry, the mask 16 being placed upon the substrate in a desired orientation. After exposure, the substrate is subjected to a developer such as vaporized trichloroethylene.

It has been found that the utilization of thin coatings of photoresist often results in the development of tiny pinholes 18 through the resist layer. This may be due to a peck of dust which lodges upon the copper surface or because of the fluid characteristics of thin layers. Such pinholes, should they form upon these portions of the surface where it is desired the photoresist remain, can ultimately result in pinholed circuitry. To overcome this possibility, there is applied a second coating of photoresist 15 to the copper clad surface 12 of the substrate 10. As has been previously mentioned, it was found desirable for reasons hereafter discussed to utilize a different photosensitive material for this second coating 15 of photoresist.

A major cause of photoresist failure is overdevelopment which may cause undesired blisters and/or peeling of the first image. Should the same photosensitive material be utilized for the second layer the second development would have a tendency to result in an overdevelopment of the remaining portions of the first coat of photoresist. Where two different photosensitive materials are used, it is relatively easy to choose a second photoresist material wherein the developing fluid therefore would have no adverse effect upon the first layer of photoresist. Secondly, as has been previously mentioned, the use of identical photosensitive materials has a tendency to result in a propagation of pinholes within the first layer of photoresist through the second layer as a result of similar viscosities and other fluid characteristics.

The second layer of photoresist 15 may be applied utilizing either spray, roller coat, or dip-coating techniques. In practice it has been found desirable to use Dynachem Resist No. 3140 (DCR–3140) an allyl phthallate as the second photoresist. The metallized glass mask 16 is then once again put in place and the substrate exposed in a manner similar to the initial exposure step. The second layer 15 is then developed and the undesired portions removed from the substrate revealing the copper surface 13 in all areas where the photoresist has been removed. The substrate is then exposed to the echant which strips the revealed copper 13 therefrom. As a final step the remaining photoresist is removed from the top surfaces of the copper circuitry leaving exposed the desired circuitry 20 upon the dielectric substrate 10.

What is claimed is:

1. In the method of manufacturing a circuit substrate having desired circuitry thereon which includes the steps of:

(a) depositing a layer of a first photosensitive material upon a substrate having a conductively clad surface, (b) exposing said material to an image of said desired circuitry to record said image upon said material, (c) developing said material to remove only that portion of said material which does not correspond with said recorded image, leaving covered with said material only that portion of said surface which does correspond with said image, (d) depositing a layer of a different photosensitive material upon said surface, wherein the characteristics of said first material are not deleteriously effected by the developing of said different material, (e) exposing said layer of different material to an image of said desired circuitry to record said image upon said second material to coincide in position with the image recorded on said first named material, (f) developing said second material in a solvent different from that used to develop said first photosensitive material to remove only that portion of said second material which does not correspond with said recorded images thereby leaving covered with both said first named and said second materials only that portion of said surface which does correspond with said recorded images, and (g) etching away the conductive cladding on all of said surface other than that portion thereof which remains covered by said first and second materials, whereby any pinholes occurring within said first named layer of material are caulked by said second layer of material assuring the production of desired circuitry devoid of pinholes.

2. The method of manufacturing a circuit substrate as described in claim 1 wherein the photosensitive material used to deposit said first-mentioned layer comprises a polyvinyl cinnamate and the photosensitive material used to deposit said second-mentioned layer comprises an allyl phthallate.

3. The method of manufacturing a circuit substrate as described in claim 1 wherein at least one of said depositing steps is accomplished by dip-coating.

4. The method of manufacturing a circuit substrate as described in claim 1 wherein the exposure, upon said first named and second layers of material, of each of said images, is accomplished by projecting light through a photomask having delineated thereon said desired circuit details, and then onto said substrate surface.

5. The method of manufacturing a circuit substrate as described in claim 1 comprising the further final step of stripping away all photosensitive material remaining subsequent said etching step.

References Cited

UNITED STATES PATENTS 3,317,320 1/1964 Reber .............. 96—36.2

GEORGE F. LESMES, Primary Examiner

R. E. MARTIN, Assistant Examiner

U.S. Cl. X.R.

156—11